(12) United States Patent
Ndip et al.

(10) Patent No.: US 11,563,266 B2
(45) Date of Patent: Jan. 24, 2023

(54) MODULE ARRANGEMENT COMPRISING AN INTEGRATED ANTENNA AND EMBEDDED COMPONENTS AND METHOD FOR MANUFACTURING A MODULE ARRANGEMENT

(71) Applicant: Fraunhofer-Gesellschaft zur Foerderung der angewandten Forschung e.V., Munich (DE)

(72) Inventors: Ivan Ndip, Berlin (DE); Andreas Ostmann, Berlin (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 15/862,833

(22) Filed: Jan. 5, 2018

(65) Prior Publication Data

US 2018/0191064 A1 Jul. 5, 2018

(30) Foreign Application Priority Data

Jan. 5, 2017 (DE) .................. 102017200126.7

(51) Int. Cl.
*H01Q 1/52* (2006.01)
*H01Q 1/24* (2006.01)
(Continued)

(52) U.S. Cl.
CPC ............ *H01Q 1/526* (2013.01); *H01Q 1/2283* (2013.01); *H01Q 1/243* (2013.01); *H01Q 1/38* (2013.01); *H01Q 15/006* (2013.01); *H01Q 15/02* (2013.01)

(58) Field of Classification Search
CPC ........ H01Q 1/38; H01Q 1/2283; H01Q 1/526; H01Q 1/243
See application file for complete search history.

(56) References Cited

U.S. PATENT DOCUMENTS

| | | | |
|---|---|---|---|
| 5,386,215 A | * | 1/1995 | Brown ..................... H01Q 1/38 |
| | | | 343/792.5 |
| 6,329,949 B1 | | 12/2001 | Barnett et al. |

(Continued)

FOREIGN PATENT DOCUMENTS

| | | |
|---|---|---|
| DE | 19954941 A1 | 6/2001 |
| DE | 69430765 T2 | 1/2003 |

(Continued)

OTHER PUBLICATIONS

YOLE Report, "Fan-out and Embedded Die: Technologies & Market Trends", "Fan-out and Embedded Die—Technologies and Market Trends", YOLE Report, Mar. 2015, Mar. 2015, 1-29.

(Continued)

*Primary Examiner* — Dieu Hien T Duong
(74) *Attorney, Agent, or Firm* — Perkins Coie LLP; Michael A. Glenn

(57) ABSTRACT

What is disclosed is a module arrangement. An antenna device and at least one electronic component are arranged next to each other and within one plane between a top side and a bottom side of the module arrangement. A shielding device which has a shielding effect relative to electromagnetic signals is located between the antenna device and the electronic component. Additionally, a method for manufacturing a module arrangement is disclosed.

15 Claims, 14 Drawing Sheets

(51) Int. Cl.
*H01Q 1/38* (2006.01)
*H01Q 1/22* (2006.01)
H01Q 15/02 (2006.01)
H01Q 15/00 (2006.01)

(56) References Cited

U.S. PATENT DOCUMENTS

| | | | |
|---|---|---|---|
| 7,522,105 B1 | 4/2009 | Lacomb | |
| 7,522,205 B2 | 4/2009 | Parks | |
| 8,411,444 B2 | 4/2013 | Gaynes et al. | |
| 2005/0073460 A1* | 4/2005 | Schmidt | H01Q 1/3233 343/700 MS |
| 2006/0049995 A1 | 3/2006 | Imaoka et al. | |
| 2007/0026567 A1* | 2/2007 | Beer | G01S 7/032 438/106 |
| 2008/0029886 A1* | 2/2008 | Cotte | H01L 23/66 257/728 |
| 2008/0186247 A1 | 8/2008 | Cotte et al. | |
| 2009/0041994 A1 | 2/2009 | Ockenfuss et al. | |
| 2009/0168367 A1 | 7/2009 | Fujii | |
| 2011/0018114 A1 | 1/2011 | Pagaila et al. | |
| 2012/0182066 A1 | 7/2012 | Merkle et al. | |
| 2013/0194754 A1 | 8/2013 | Jung et al. | |
| 2014/0110840 A1* | 4/2014 | Wojnowski | H01L 23/49822 257/738 |
| 2015/0325925 A1 | 11/2015 | Kamgaing et al. | |
| 2017/0181287 A1 | 6/2017 | Jhang et al. | |
| 2017/0236776 A1 | 8/2017 | Huynh et al. | |
| 2018/0332151 A1* | 11/2018 | Kamgaing | G06F 1/1613 |
| 2019/0081013 A1 | 3/2019 | Chen et al. | |
| 2019/0305429 A1* | 10/2019 | Ying | H01Q 5/378 |

FOREIGN PATENT DOCUMENTS

| | | |
|---|---|---|
| DE | 19954941 C2 | 6/2003 |
| DE | 102005032489 B3 | 11/2006 |
| DE | 102006023123 A1 | 1/2007 |
| DE | 102013111569 A1 | 4/2014 |
| EP | 0611129 B1 | 6/2002 |
| JP | 2004096259 A | 3/2004 |
| JP | 2007129304 A | 5/2007 |
| WO | 0137338 A2 | 5/2001 |

OTHER PUBLICATIONS

Kunud Ranjan Jha, Analysis and design ofterahertz microstrip antenna on photonic bandgap material, Aug. 2012, pp. 364-373 (Year: 2012), Mar. 23, 2020.

* cited by examiner

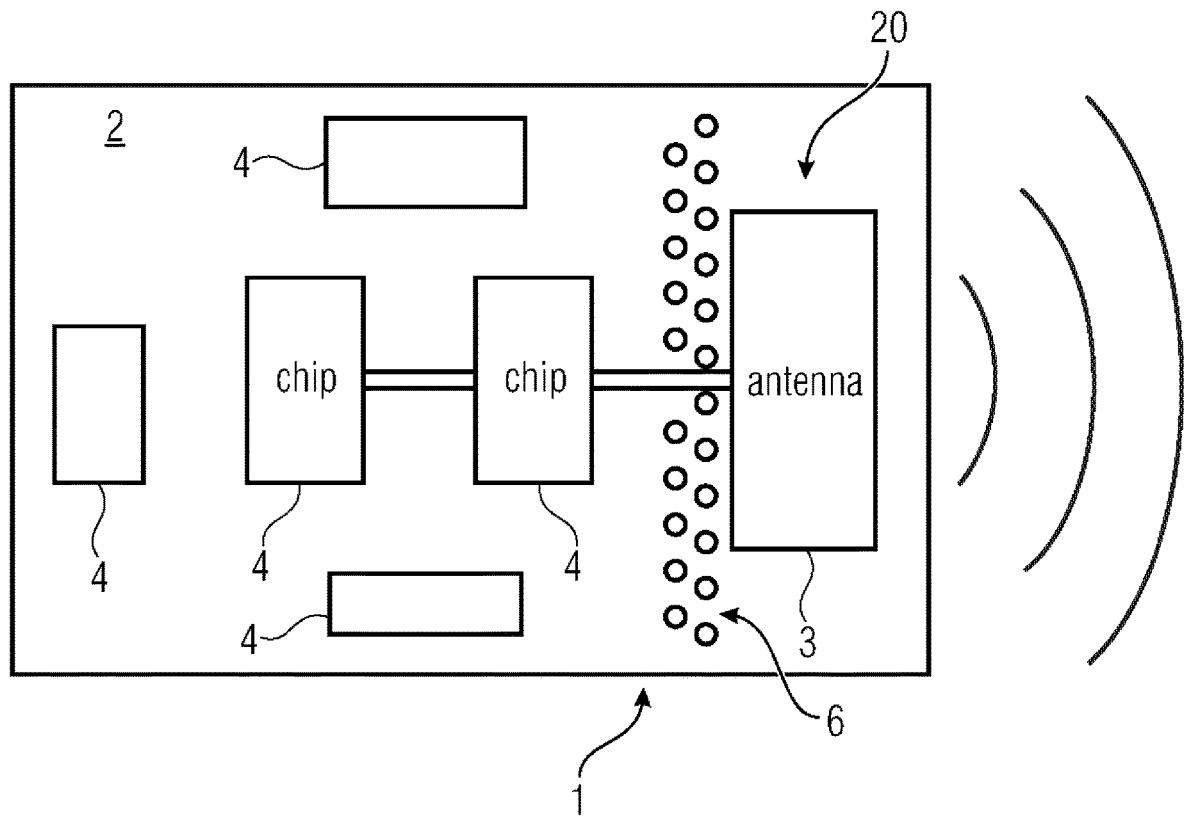
Fig. 13
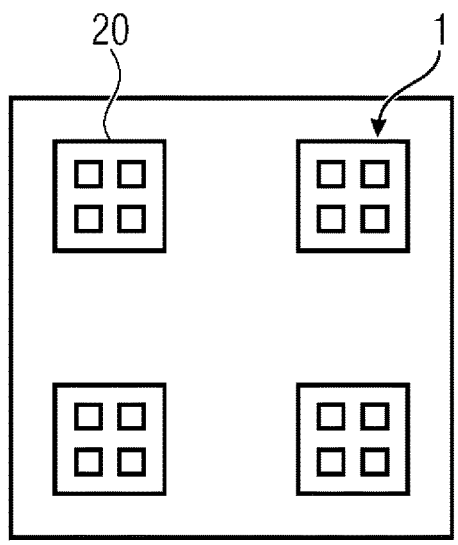 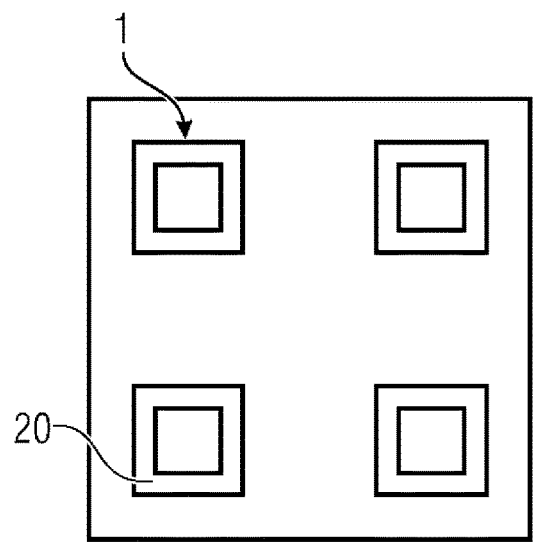
Fig. 14a  Fig. 14b

MODULE ARRANGEMENT COMPRISING AN INTEGRATED ANTENNA AND EMBEDDED COMPONENTS AND METHOD FOR MANUFACTURING A MODULE ARRANGEMENT

CROSS-REFERENCE TO RELATED APPLICATION

This application claims priority from German Application No. 10 2017 200 126.7, which was filed on Jan. 5, 2017, which is incorporated herein in its entirety by this reference thereto.

BACKGROUND OF THE INVENTION

The invention relates to a module arrangement and to a method for manufacturing a module arrangement.

Module arrangements on which electronic components are applied are known and used in many fields of technology. Relevant and critical fields and topics in such module arrangements are the electric connection between the components, contacting components from outside or reducing the space requirements of the components, for example, and, consequently, decreasing the arrangement in size. Frequently, the goal is increasing the integration density.

Printed circuit boards (also referred to as PCBs) are potential components of the module arrangements and generally are made of an electrically insulating material and comprise conductive connections in the form of conductive tracks on their (top and bottom) sides.

Thus, arrangements comprising a printed circuit board or several printed circuit boards arranged one above the other (so-called multi-layer printed circuit boards) are known. So-called prepregs are sometimes used for manufacturing the printed circuit boards. These are semi-finished textile fiber matrix products pre-impregnated with resins which are cured under the influence of pressure and temperature.

It is known in conventional technology to embed components or chips in the printed circuit boards, for example. Two basic methods are differentiated between, which differ in the fact whether the contacts or pins of the components are facing the printed circuit board (so-called face-down embedding) or facing away from the printed circuit board (so-called face-up embedding). Thus, particularly, the components are embedded in the material of the printed circuit board (see, for example, DE 199 54 941 A1, DE 10 2005 032 489 B3 or DE 694 30 765 T2).

SUMMARY

An embodiment may have a module arrangement, wherein an antenna device and at least one electronic component are arranged next to each other and within one plane between a top side and a bottom side of the module arrangement, wherein a shielding device is provided between the antenna device and the at least one electronic component, and wherein the shielding device has a shielding effect relative to electromagnetic signals.

Another embodiment may have a method for manufacturing a module arrangement, wherein the module arrangement is produced such that an antenna device and at least one electronic component are located within one plane and next to each other and such that a shielding device which is implemented so as to exhibit a shielding effect relative to electromagnetic radiation is provided between the antenna device and the at least one electronic component.

Thus, an antenna device and at least one electronic component are arranged next to each other and within one plane between a top side and a bottom side of the module arrangement. In addition, a shielding device is arranged between the antenna device and the at least one electronic component. The shielding device is configured so as to be of a shielding effect relative to electromagnetic signals.

The antenna device and at least one electronic component are located within one plane. Thus, depending on the implementation, the antenna device and/or the at least one electronic component protrude/s beyond said plane. When viewing the module arrangement from one side to the other side (that is from the top to the bottom side, or vice versa), the antenna device and at least one electronic component are located at least partly at a common height or at a common height band.

The shielding device protects the at least one electronic component or protects, if applicable, several electronic components from the electromagnetic signals of the antenna device. However, conversely, the electromagnetic component(s) is/are also prevented from having a potential effect on the antenna device.

One implementation provides for the shielding device to be a number of so-called via holes (shielding vias).

In one implementation, it is provided for the module arrangement to comprise at least one carrier layer. Thus, the antenna device and the at least one electronic component are embedded or integrated in the support layer or substrate. Advantageously, the shielding device is also located or embedded at least partly in the support layer. By means of the support layer which supports the antenna device and the at least one electronic component, consequently, in this implementation, the plane within which the antenna device and the at least one electronic component are located next to each other is defined. In one implementation, the support layer is a printed circuit board.

In one implementation, the module arrangement comprises several electronic components.

In one implementation, it is provided for at least the plurality of electronic components of the module arrangement and the antenna device to be located within the common plane. In one implementation, all the electronic components of the module arrangement, together with the antenna device, are located within said one plane.

One implementation is for several electronic components to be embedded in the support layer.

The support layer is exemplarily made of a polymer, of a laminate suitable for high frequencies, of glass or another dielectric.

One implementation provides for a distribution layer for distributing electrical energy and/or electrical signals to be provided. This implementation allows realizing the connection between the electronic components and/or between the components and the antenna device within the module arrangement.

One implementation is for contacts for contacting the module arrangement to be merged on a bottom side of the module arrangement. In this implementation, the ways of contacting the module arrangement, using which the module arrangement can be accessed from outside or using which the module arrangement—in the connected and inserted state—can act on external apparatuses, devices, elements, systems etc. are bundled and assembled on the bottom side. The top side, in contrast, exemplarily serves for emitting the electromagnetic signals. Alternatively or additionally, the signals are emitted using a lateral area of the module arrangement.

One implementation provides for ball grid array solder balls to be present on a bottom side of the module arrangement. Alternatively or additionally, so-called "heat balls" for dissipating heat are placed on the bottom side.

One implementation is for the antenna device to comprise an interrupted emission area.

On implementation provides for the antenna device to comprise a continuous emission area.

In one implementation, the emission area is placed on the top side of the module arrangement and, thus, opposite the bottom side having the contacts of the module arrangements guided outside.

The antenna device in one implementation comprises a—continuous or interrupted—metal area which in one implementation represents the emission area on the top side of the module arrangement.

In one implementation, the antenna device comprises an element or, in another implementation, is made of several elements which are summed up to form an array.

The antenna device in one implementation is provided with a vertical feed line, a so-called "proximity feed", a so-called "aperture-coupled feed" or planar feeds.

Depending on the implementation, the antenna device exemplarily comprises at least one patch antenna, a grid array antenna or a slot antenna. Alternatively, it comprises at least one antenna having a waveguide which is formed at least partly by an antenna substrate. In other implementations, dipole, monopole, Yagi-Uda or Vivaldi antennas may be provided, for example. In alternative or additional implementations, reconfigurable and/or small antennas (so-called "electrically small antennas", which are very small relative to their radian sphere pursuant to the definition by H. A. Wheeler) may be provided. Other variations and configurations may also be realized.

One implementation is for contacting terminals of the electronic components to be facing a top side of the module arrangement. In this implementation, the components are arranged such that the contacting terminals thereof are directed to the top side of the module arrangement. When, in one implementation, the contacts for contacting the module arrangement are to be located on the bottom side, corresponding connective structures from the contacting terminals to the bottom side are to be provided.

One implementation provides for the at least one electronic component to be a chip (like an RF chip) and/or a passive electronic element (like inductance, capacitor, electrical resistor, filter, switch or directional coupler).

In one implementation, at least one electronic component is embedded and/or produced directly in the support layer. The electronic component embedded in the support layer in this way is implemented as a capacitor, for example, which may be located close to the active components, like the chips. Thus, energy distribution can be stabilized. Alternatively or additionally, inductances are provided as electronic components.

One implementation is for at least one electronic component to be connected to a cooling body—in particular directly or at least via thermally conductive adhesive only. Thus, the cooling body is exemplarily connected to one side of the respective component.

In one implementation, the at least one electronic component is thermally connected to a cooling body via a metal core. Alternatively, the metal core can be referred to as metal layer. The metal core is part of the module arrangement.

In one implementation, the at least one electronic component is thermally connected to a cooling body via at least one via hole (so-called "thermal via").

In another implementation, the at least one electronic component is thermally connected to a cooling body via a metal core and via at least one via hole. This is a combination of the two implementations mentioned before.

In accordance with one implementation, the module arrangement comprises holes in the region of the antenna device.

One implementation provides for the antenna substrate which supports the antenna device to comprise holes in the region on the antenna device. In an alternative or additional implementation, the support layer which supports the antenna device comprises holes in the region of the antenna device. In one implementation, the holes form a photonic bandgap structure which filters surface waves. Alternatively or additionally, the holes reduce the permittivity of the substrate which supports the antenna device. The implementation with the holes allows using larger dimensioned antenna structures in the millimeter wave or terahertz ranges. The larger dimensions also reduce the impacts of manufacturing tolerances. Alternatively or additionally, electromagnetic bandgap structures are present in the module arrangement.

One implementation is for a spacer to be present. Thus, the spacer is arranged in the region of the antenna device. Furthermore, the spacer is arranged either between a top side of the module arrangement and the antenna device or the spacer is arranged between a bottom side of the module arrangement and the antenna device. In one implementation, the spacer is located below the antenna device such that the antenna device is as close as possible to the top side of the module arrangement. Using the spacer allows the antenna substrate which supports the antenna device to comprise a different and, in particular, smaller height than the electronic components. The difference in height is compensated by the spacer.

In one implementation, the components and the antenna device, or the antenna substrate supporting the antenna device, are arranged such that they form a planar surface towards one side (like the top side) of the module arrangement. Towards the opposite side (thus, exemplarily, the bottom side), the differences in height are compensated by the spacer so that the result is also a planar surface.

One implementation provides for the module arrangement to comprise an antenna substrate. Thus, the antenna substrate supports the antenna device. The antenna substrate here is implemented to be a dielectric. The material of the antenna substrate selected here is also dependent on the characteristics of the antenna device.

One implementation is for the antenna substrate to be part of the support layer. In one implementation, the antenna device is manufactured directly on and/or in the support layer. In an alternative implementation, the antenna device is integrated in a sub-layer and this sub-layer is merged with another sub-layer which supports the electronic components to form the support layer.

On implementation provides for the antenna device to be manufactured separately from the module arrangement. In this implementation, the antenna device is manufactured on a separate antenna substrate and subsequently is embedded into the support layer or, alternatively, is connected to the support layer such that the antenna device and the at least one electronic component are located within one plane.

One implementation provides for the module arrangement to comprise a complementary layer. In one implementation, the complementary layer is a printed circuit board. The complementary layer thus is arranged either between a top side of the module arrangement and the support layer or between a bottom side of the module arrangement and the support layer. In one implementation, the complementary layer, when looking from the top towards the bottom side of the module arrangement, is located below the support layer. In this implementation, the complementary layer may also function as a tempering layer by providing corresponding structures or elements for dissipating heat of the electronic components towards the bottom side.

In another implementation, the complementary layer is configured and arranged relative to the support layer and/or relative to at least one electronic component such that the complementary layer compensates a difference in height between at least one electronic component and the antenna device or the antenna substrate thereof. In one implementation, the complementary layer consequently is made of a thermally well conducting material, like a respective dielectric.

In one implementation, it is provided for the module arrangement to comprise at least one cover layer and for the cover layer to be arranged between the top side and the support layer. Thus, the cover layer is located above the support layer and, consequently, also above the antenna device.

In one implementation, the support layer is located between at least one complementary layer and at least one cover layer. In this implementation, the antenna device may radiate only in a lateral direction.

In one implementation, there is a structure for focusing the radiation of the antenna device. This structure may, for example, be a lens. In one implementation, the structure is arranged above the antenna device. In another implementation, the structure is located laterally at the module arrangement.

Additionally, the object of the invention is achieved by a method for producing a module arrangement.

The method provides for the module arrangement to be produced such that an antenna device and at least one electronic component are located within one plane and next to each other and such that a shielding device which is implemented so as to have a shielding effect relative to electromagnetic signals is located between the antenna device and the at least one electronic component.

One implementation of the method comprises the antenna device and the at least one electronic component to be embedded into a support layer.

The above implementations of the module arrangement may be realized by corresponding steps of the manufacturing method so that the above discussion applies here as well. This is why a repetition is omitted.

BRIEF DESCRIPTION OF THE DRAWINGS

Embodiments of the present invention will be detailed subsequently referring to the appended drawings, in which:

FIG. 13 shows a top view of a schematic illustration of a module arrangement, FIGS. 14a, 14b show top views of two different implementations of the module arrangement.

DETAILED DESCRIPTION OF THE INVENTION

Figure 1:
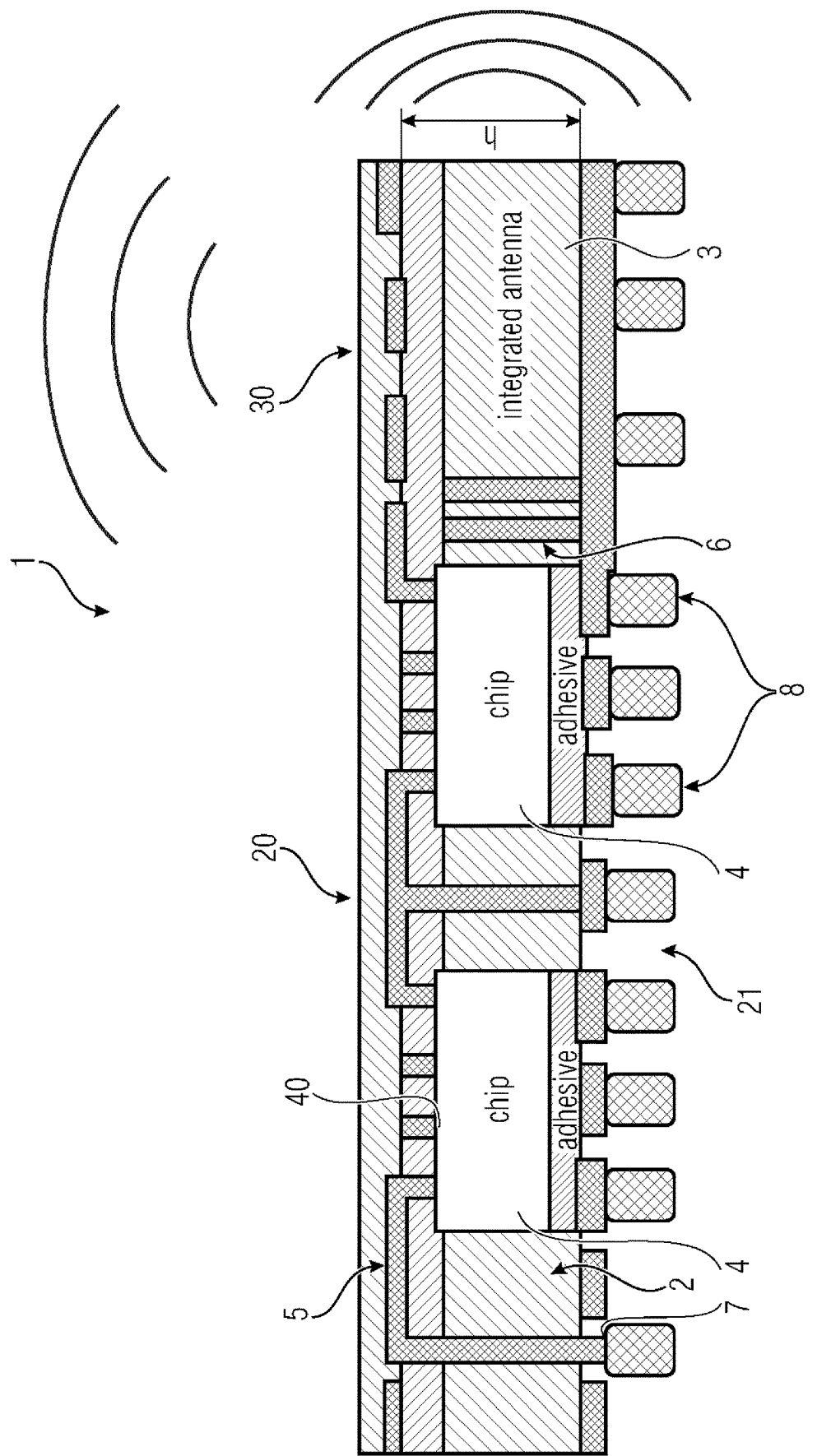
FIG. 1 shows a sectional view of a schematic illustration of a first implementation of the module arrangement.

The module arrangement 1 of FIG. 1 comprises a printed circuit board as an example of a support layer 2 in which an antenna device 3 is integrated and two chips as electronic components 4 are embedded.

Starting from a top side 20 of the module arrangement 1 which in the implementation shown is a top side of the support layer 2, towards a bottom side 21 of the module arrangement 1 or the support layer 2, the electronic components 4 and the antenna device 3 are located at least partly at the same height and at least within the same plane which in this case is the support layer 2.

The antenna device 3 is implemented at least for emitting electromagnetic signals which is indicated here by waves. The signals here are emitted in a vertical direction (that is perpendicular to the top side 20 of the module arrangement 1) and in an azimuthal direction (that is starting from a lateral area of the module arrangement 1) in the implementation shown. The antenna device 3 comprises a respective suitable emission area 30 which, in the implementation shown, is located on the top side 20 of the module arrangement 1. The material of the support layer 2 which is located in the region of the antenna device 3 and thus also forms the antenna substrate has effects on the characteristics of the antenna device 3. The thickness of the support layer 2 in this area is also relevant so that the height h is indicated here.

The antenna device 3 is located at one side of or the edge of the module arrangement 1 so that the electromagnetic signals can leave the support layer 2 in one direction in an unimpeded manner. In the direction towards the electronic components 4, two via holes are provided as a shielding device 6 for protecting same from the signals.

A distribution layer 5 within which the respective structures, connections or, generally, lines are embedded is provided for connecting the electronic components 4 among one another or for driving the antenna device 3.

It can be seen that the electronic components—here the chips—4 each comprise their contacting terminals 40 in the direction towards the top side 20. Thus, the connections between the components 4 or between the components 4 and the antenna device 3 are located in the distribution layer 5 which, when viewed from the bottom side 21, is arranged above the support layer 2.

Those contacting terminals 40 of the components 4 which allow a connection to the outside, are guided to the bottom side 21 of the module arrangement 1 and lead to contacts 7 for contacting the module arrangement 1.

Ball grid array solder balls 8 (alternatively heat balls) are provided on the bottom side 21 for mounting the module arrangement 1 on a support element—which is not illustrated here—or another element etc.

In the following implementations, only the differences to the implementation of FIG. 1 will be discussed in order to avoid repetitions.

Figure 2:
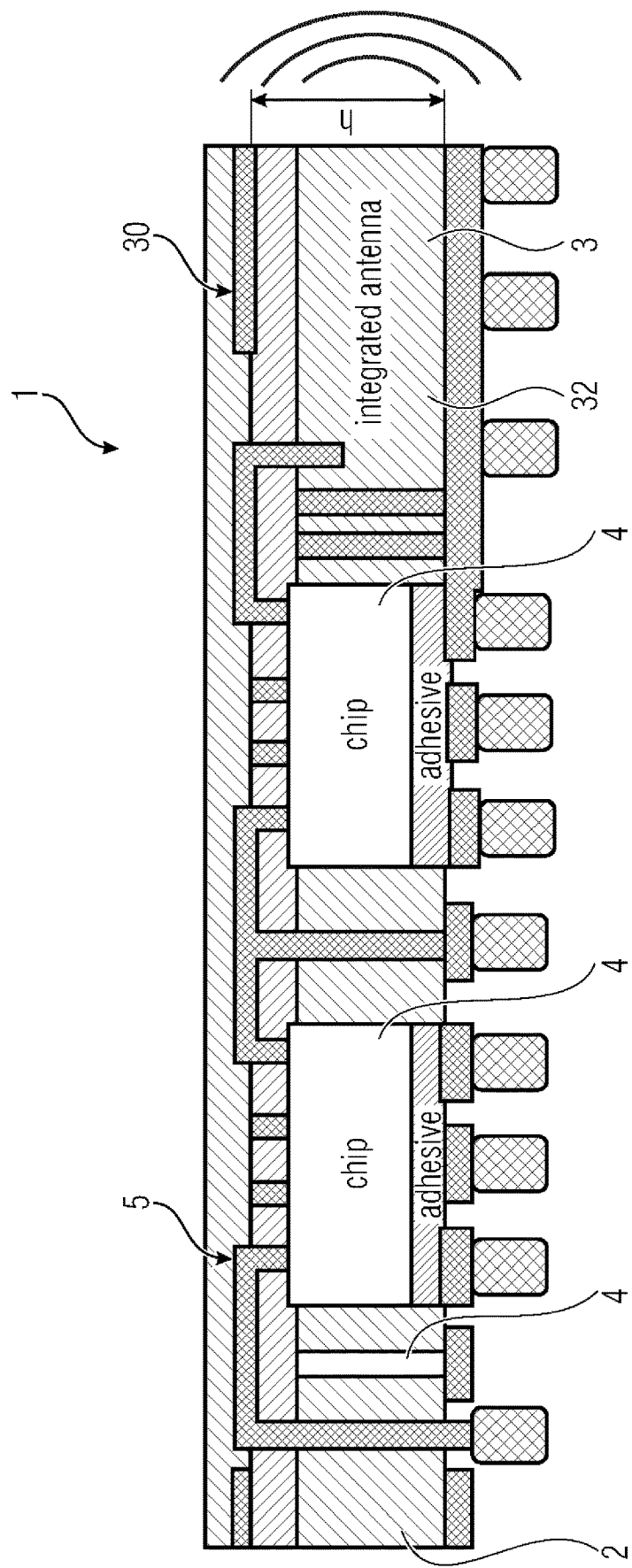
FIG. 2 shows a sectional view of a schematic illustration of a second implementation of the module arrangement.

The implementation of FIG. 2 differs from the variation of FIG. 1 in that the emission area 30 of the antenna device 3 of FIG. 1 is interrupted and is continuous in FIG. 2. In the variation of FIG. 2, the effect of this is that the electromagnetic signals are emitted only laterally. It can also be recognized that a connection between a chip 4 and the antenna device 3 leads into the antenna substrate 32. The antenna substrate 32 here is a part of the support layer 2. It becomes obvious here that the antenna device 3 is embedded in the support layer 2.

In addition, a passive element as an electronic component 4, which is a capacitor, a coil, a resistor, a diode or a switch, for example, is embedded in the support layer 2 of FIG. 2. The contacting of the passive element here, as is the case for the two chips 4, takes place via the distribution layer 5.

Figure 3:
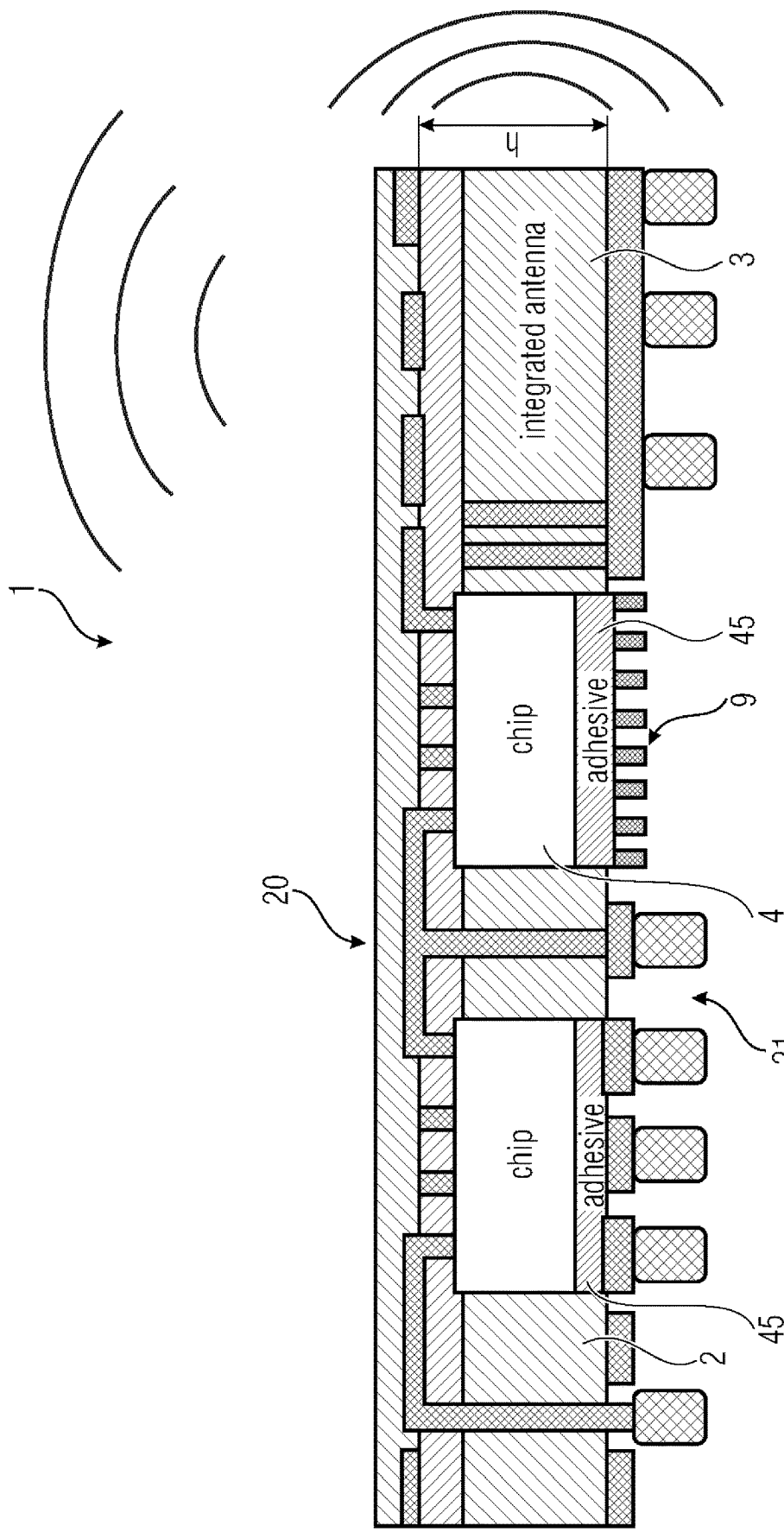
FIG. 3 shows a sectional view of a schematic illustration of a third implementation of the module arrangement.

FIG. 3 shows an implementation where a chip 4, at its top side which here is located in the direction towards the bottom side 21 of the module arrangement 1, is connected to a cooling body 9 for dissipating heat. An adhesive 45 is provided for the connection between the chip 4 and the cooling body 9.

Figure 4:
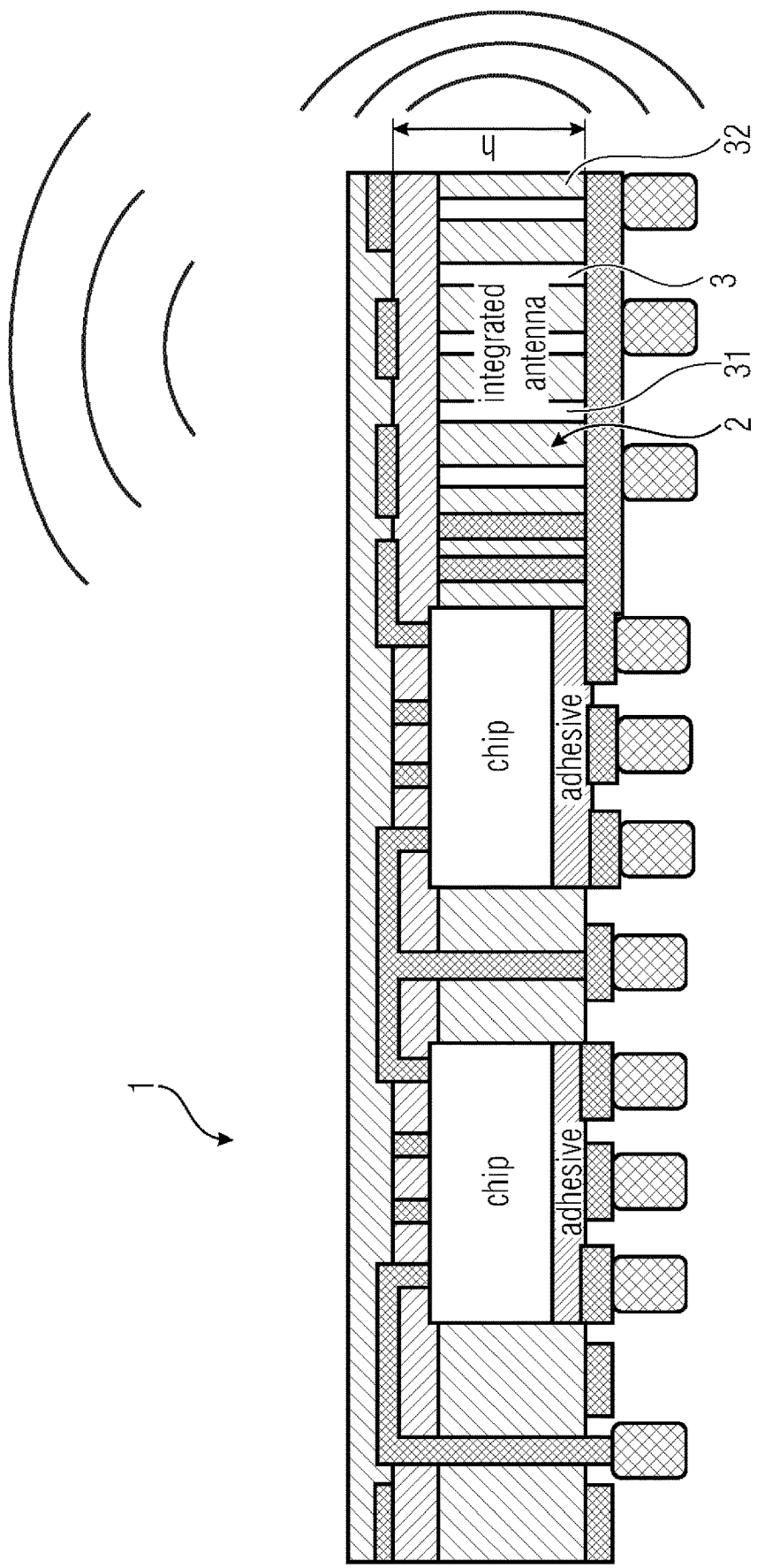
FIG. 4 shows a sectional view of a schematic illustration of a fourth implementation of the module arrangement.

In the embodiment of FIG. 4, the antenna device 3 emits electromagnetic signals in a vertical and an azimuthal direction. The antenna substrate 32 which in this case is also part of the support layer 2 is provided with holes 31 in the region of the integrated antenna device 3. The holes 31 here are particularly implemented and arranged such that the result is a photonic bandgap structure in order to filter surface waves. Furthermore, the permittivity of the antenna substrate 32 is decreased by this, which also has an effect on the characteristics of the antenna device 3.

Figure 5:
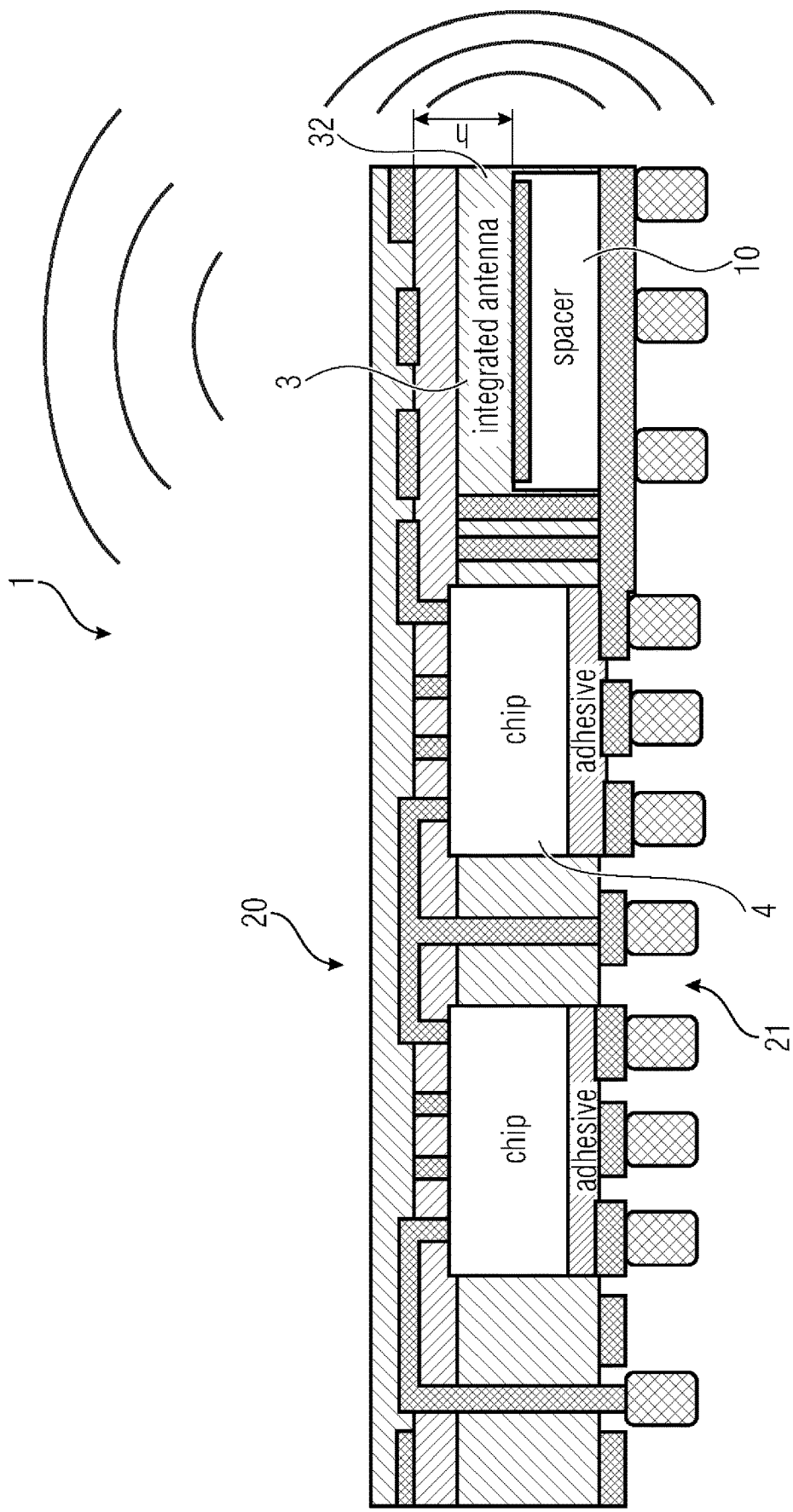
FIG. 5 shows a sectional view of a schematic illustration of a fifth implementation of the module arrangement.

In the variations of FIGS. 1 to 4, the respective components 4 comprise the same height as the antenna substrate 32 or as that region which the antenna device 3 extends over. Of disadvantage with the dependence of the height of the antenna substrate 32 on the dimensions of the electronic components 4 is the fact that the transmission and reception characteristics of the antenna device 3 are consequently also dependent on these dimensions. However, in some applications, it is of more advantage for the antenna substrate 32 to be implemented to be thin. Consequently, the height h of the antenna substrate 32 in some implementations is smaller than the height of the electronic components 4. This is illustrated in FIG. 5.

In order to obtain a planar bottom side 21 despite the difference in height, in the embodiment illustrated, a spacer 10 which provides for the height compensation is provided below the antenna device 3 and, thus, in the direction towards the bottom side 21.

Figure 6:
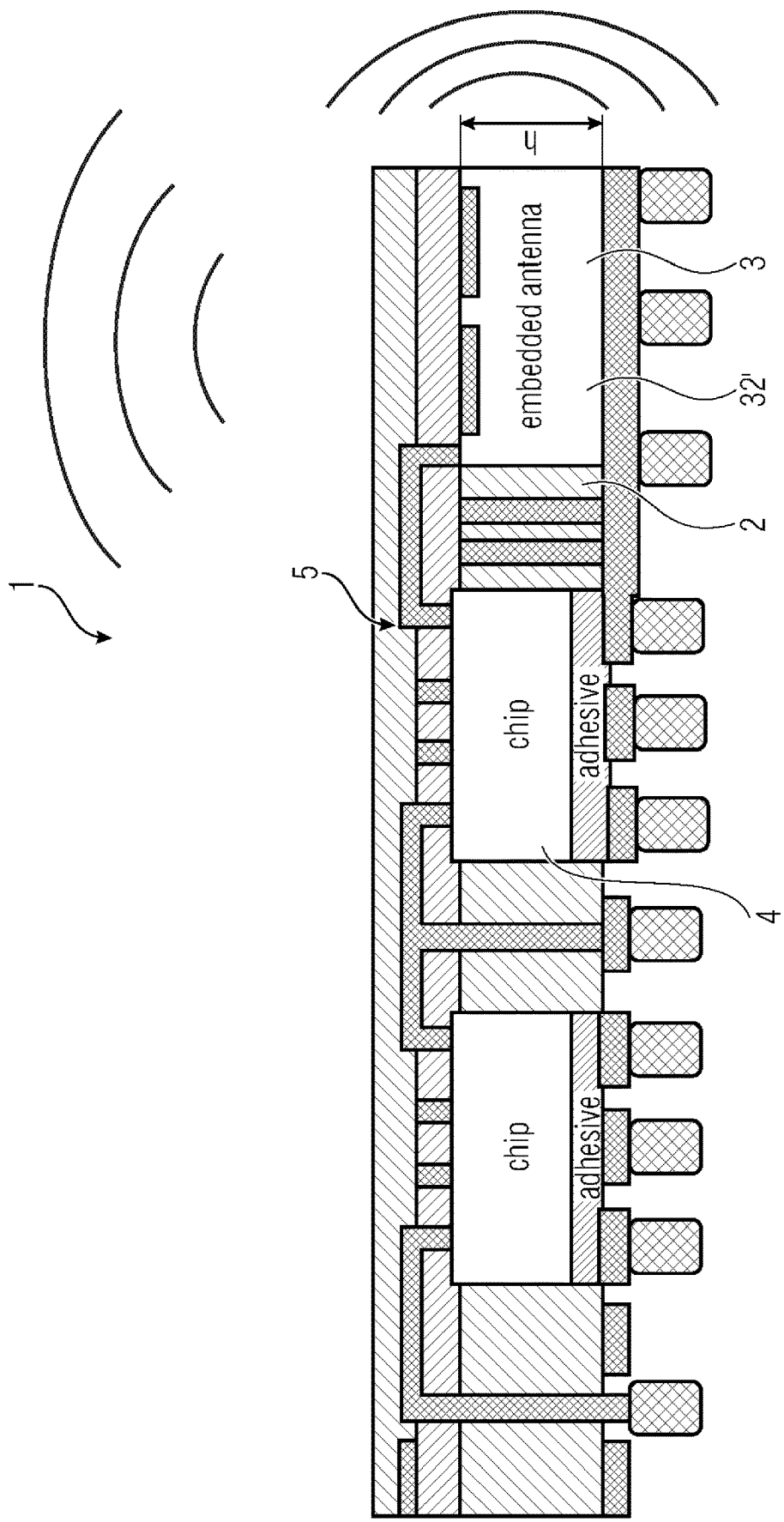
FIG. 6 shows a sectional view of a schematic illustration of a sixth implementation of the module arrangement.

The antenna device 3 of the implementation of FIG. 6 is manufactured separately from the support layer 2 and subsequently embedded into the support layer 2. In addition, the respective connections between the electronic components 4 and the antenna device 3 are made via the distribution layer 5. The antenna substrate 32' of the antenna device 3 here is made of a different material than the support layer 2, like glass, for example.

This implementation of the module arrangement 1 of FIG. 6 thus relates to a separately or individually produced antenna device 3 which is embedded in the support layer 2 as a whole—and consequently also with its antenna substrate 32'. Thus, embedding in one implementation refers to the fact that the antenna device 3 is surrounded by the support layer 2. In an alternative implementation, the antenna device 3 is fixedly connected to support layer 2 laterally, wherein the antenna device 3 and electronic components 4 are located within a common plane.

Figure 7:
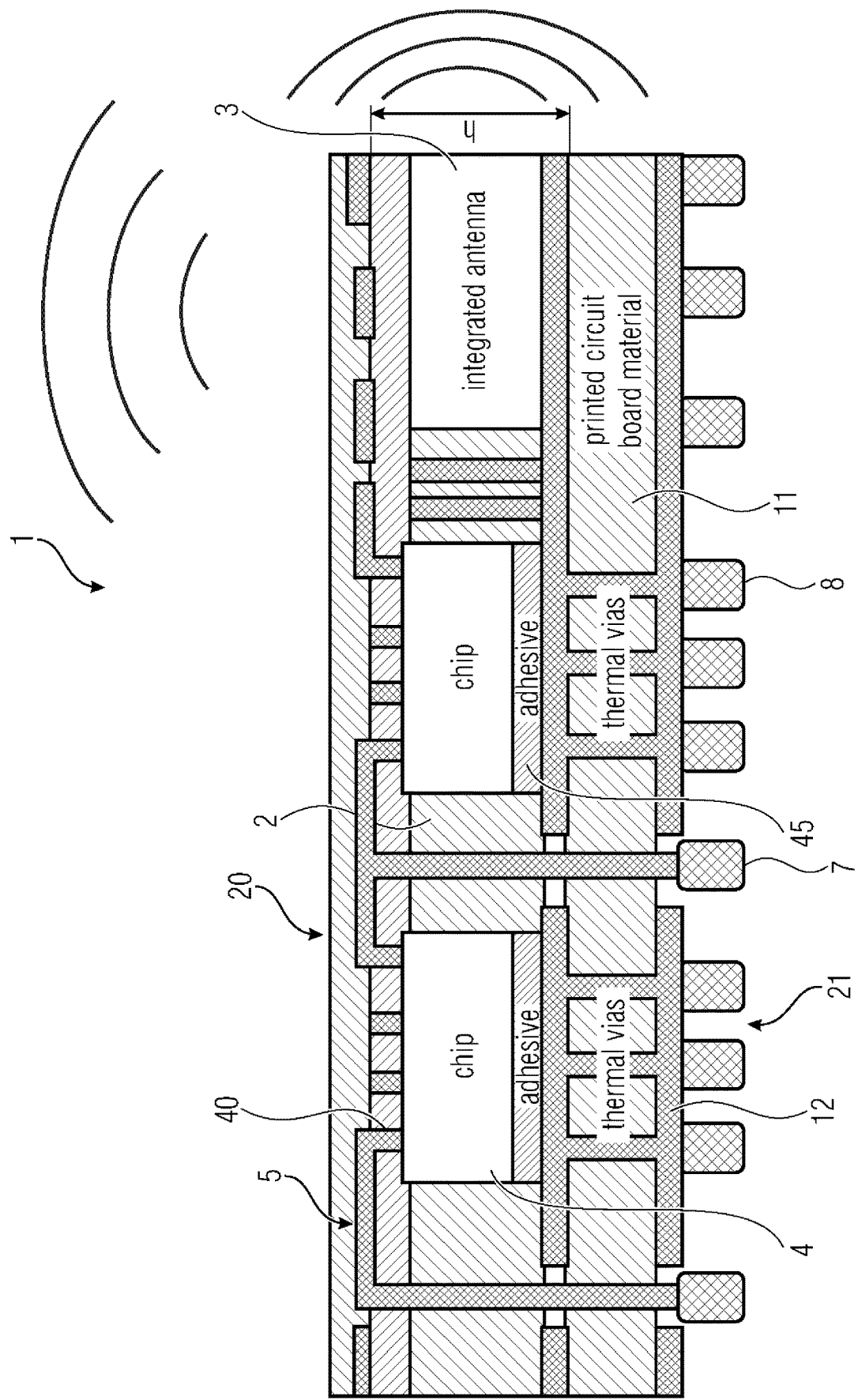
FIG. 7 shows a sectional view of a schematic illustration of a seventh implementation of the module arrangement.

In the variation of FIG. 7, a complementary layer 11 is present below the support layer 2 and is connected to the support layer 2 like via an adhesive 45 or via a prepreg layer.

The complementary layer 11 which in one implementation is made from a conventional printed circuit board material, as is the support layer 2, also serves for tempering the electronic components 4. This is done using thermally active via holes (so-called thermal vias) 12 which are located below the electronic components 4 and which, in the embodiment illustrated, lead to the bottom side 21 of the module arrangement 1.

The contacting terminals 40 of the components 4 are also guided to the bottom side 21, thereby allowing a connection to the outside, which means that they terminate at the contacts 7 of the module arrangement 1.

In the implementation shown, the electronic components 4 and the antenna device 3 are embedded in the support layer 2 and consequently are located within one plane.

Figure 8:
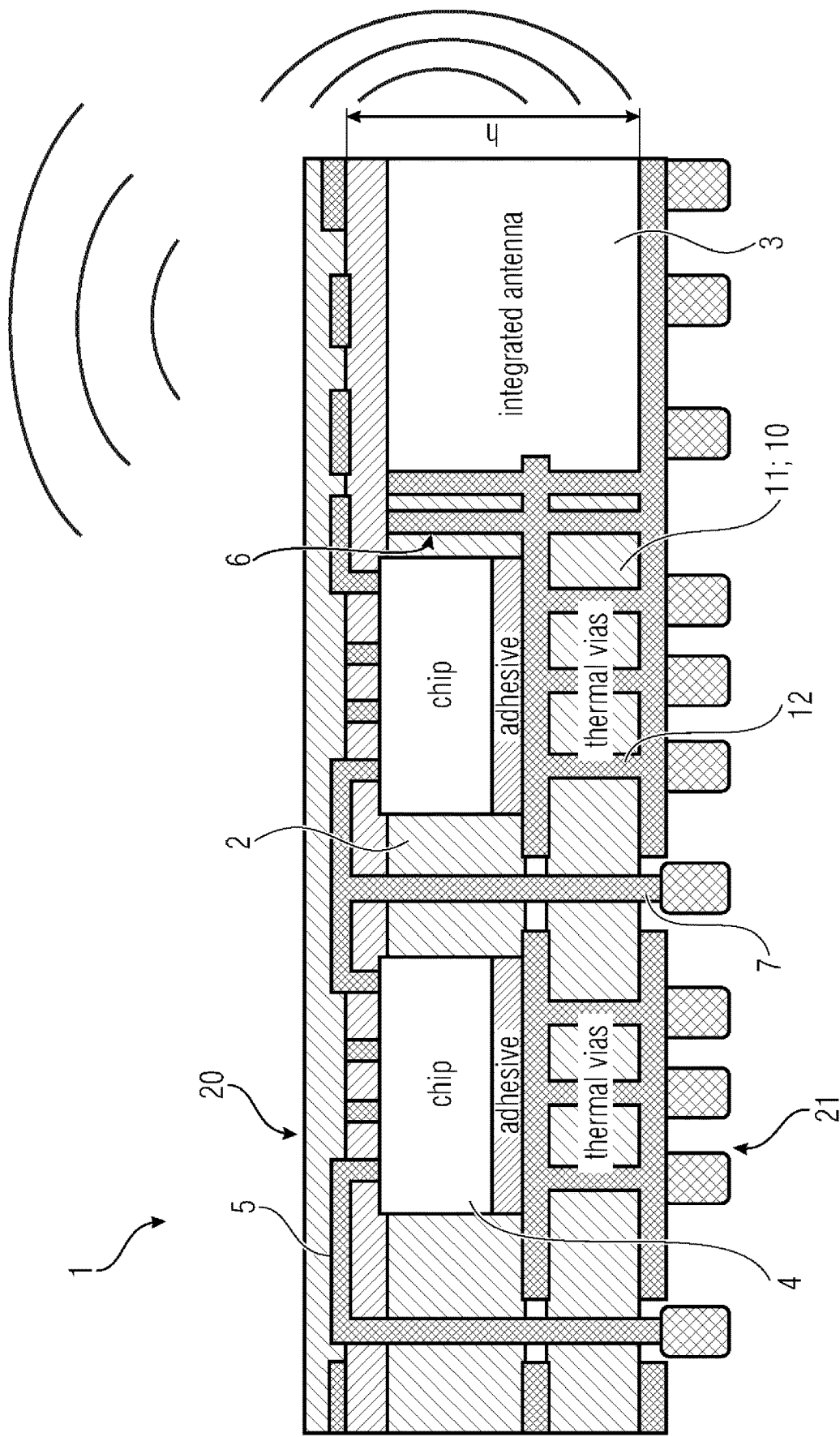
FIG. 8 shows a sectional view of a schematic illustration of an eighth implementation of the module arrangement.

In the variation of FIG. 8, the complementary layer 11 is located only below that part of the support layer 2 which supports the electronic components 4. The antenna device 3 here is implemented to be considerably higher than the electronic components 4 so that the complementary layer 11—exemplarily formed from a printed circuit board—here takes the role of the spacer 10 and compensates the difference in height between the electronic components 4 and the antenna device 3.

The components 4 and the antenna device 3 here are embedded into a common support layer 2 which is made of two parts: one part of low a height for the components 4 and one part, comprising a greater height, for the antenna device 3. Bother parts are connected to each other correspondingly and also to the complementary layer 11.

The via holes which are continuous over the entire height here also protect the electronic components 4 from the electromagnetic signals of the antenna device 3 as shielding devices 6.

Figure 9:
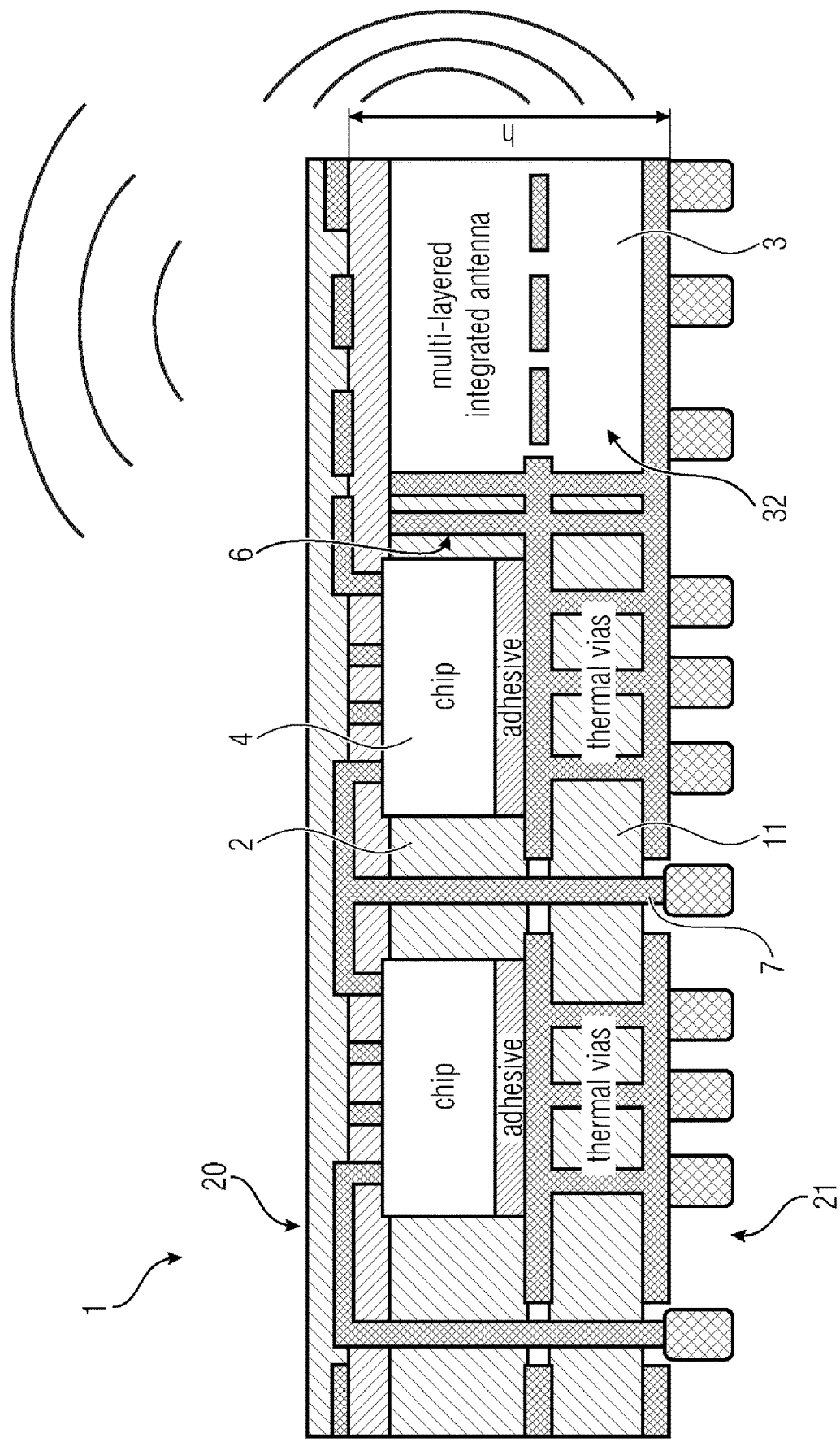
FIG. 9 shows a sectional view of a schematic illustration of a ninth implementation of the module arrangement.

The difference between the variations of FIG. 8 and FIG. 9 is that the antenna device 3 achieves its height h by several layers. Part of the structure of the antenna device 3 here is exemplarily indicated to be centered. The antenna substrate 32 is thus made up of the support layer 2 and also the complementary layer 11. This means that the antenna device 3 and the electronic components 4 are integrated in a common support layer 2 or are both located within a common plane. The antenna device 3, however, protrudes beyond the common plane and, in the implementation illustrated, thus is located in the complementary layer 11.

The top side 20 and a lateral phase here also serve for emitting electromagnetic signals of the antenna device 3. The contacts 7 are arranged on the bottom side 21, which allows contacting the module arrangement 1, and this is where the regions for specifically dissipating the heat produced are located.

In the variation of FIG. 9, several via holes acting as shielding devices 6 for separation relative to electromagnetic signals are located between the electronic components 4 and the antenna device 3.

Figure 10:
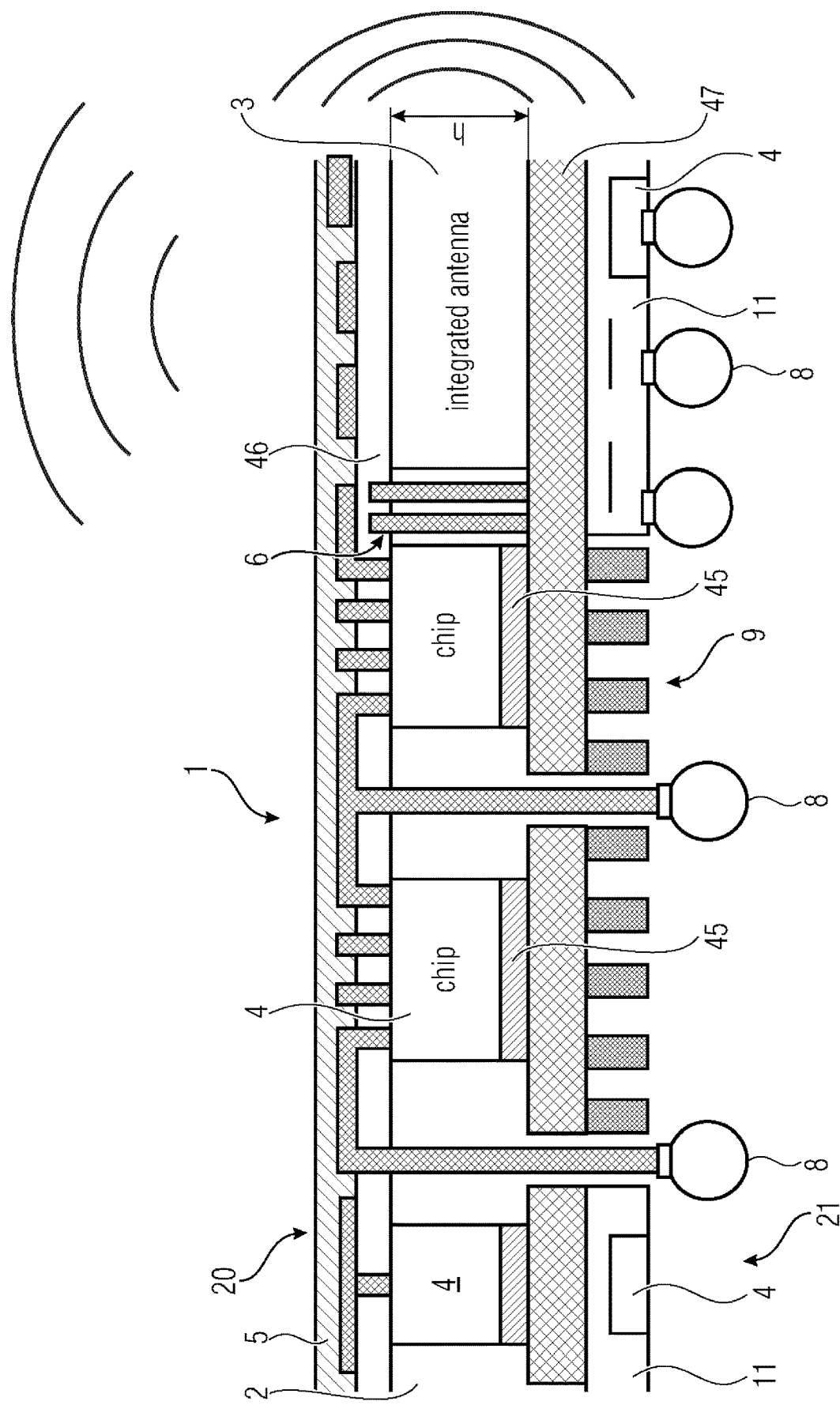
FIG. 10 shows a sectional view of a schematic illustration of a tenth implementation of the module arrangement.

In the implementation of the module arrangement 1 of FIG. 10, several electronic components 4 and the integrated antenna device 3 are arranged next to one another in the support layer 2. Several shielding devices 6 which here are implemented as via holes (so-called shielding vias) and exhibit a shielding effect relative to the radiation of the antenna device 3 are located between a chip as the electronic component 4 and the antenna device 3. The via holes 6 having the electromagnetically shielding effect project into the prepreg layer 46 which is located above the support layer 2 and serves for contacting further layers. In this case, this is the distribution structure 5.

The electronic components 4 are fixed on a metal core 47 using a thermally conductive adhesive 45. A complementary layer 11 which also receives further electronic components 4 is located below the metal core (alternative term: metal layer) 47.

Cooling bodies 9 which serve for dissipating the heat of the chips are provided on the metal core 47 and thermally connected to the same, in the regions below the two chips 4.

The structures for electrically contacting the two chips of the electronic components 4 illustrated here each lead to solder balls 8 which are located at the same height as the other solder balls 8 which rest on the bottom side of the complementary layer 11.

Figure 11:
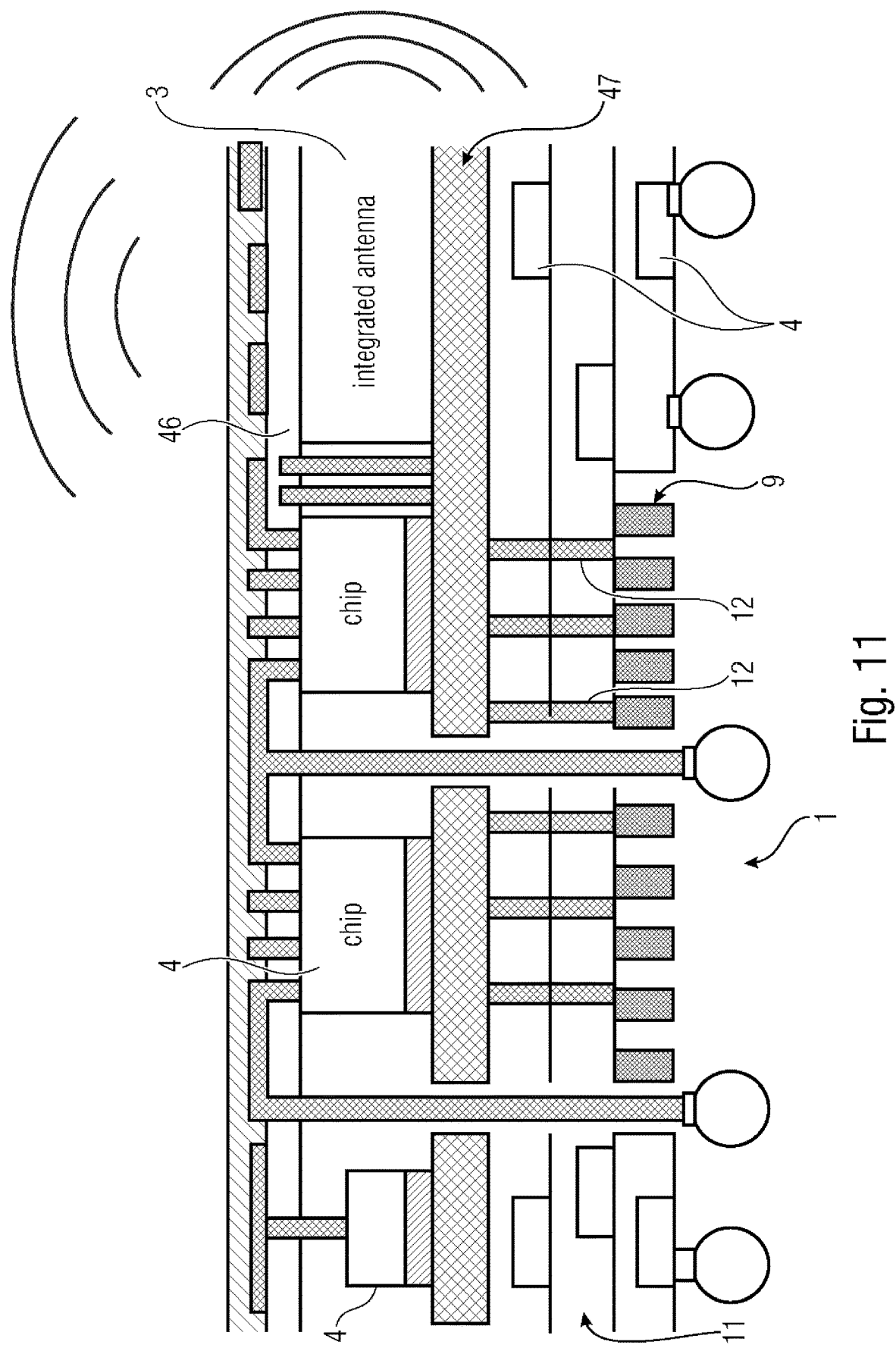
FIG. 11 shows a sectional view of a schematic illustration of an eleventh implementation of the module arrangement.

The cooling function of the module arrangement 1 of FIG. 11 differs from the cooling mechanism of the module arrangement 1 of FIG. 10 in that the metal core 47 is contacted thermally by via holes (so-called thermal vias) 12 and the via holes 12 in turn terminate on cooling bodies 9.

In addition, several complementary layers 11 in which electronic components 4 are embedded are located below the metal core 47.

Figure 12:
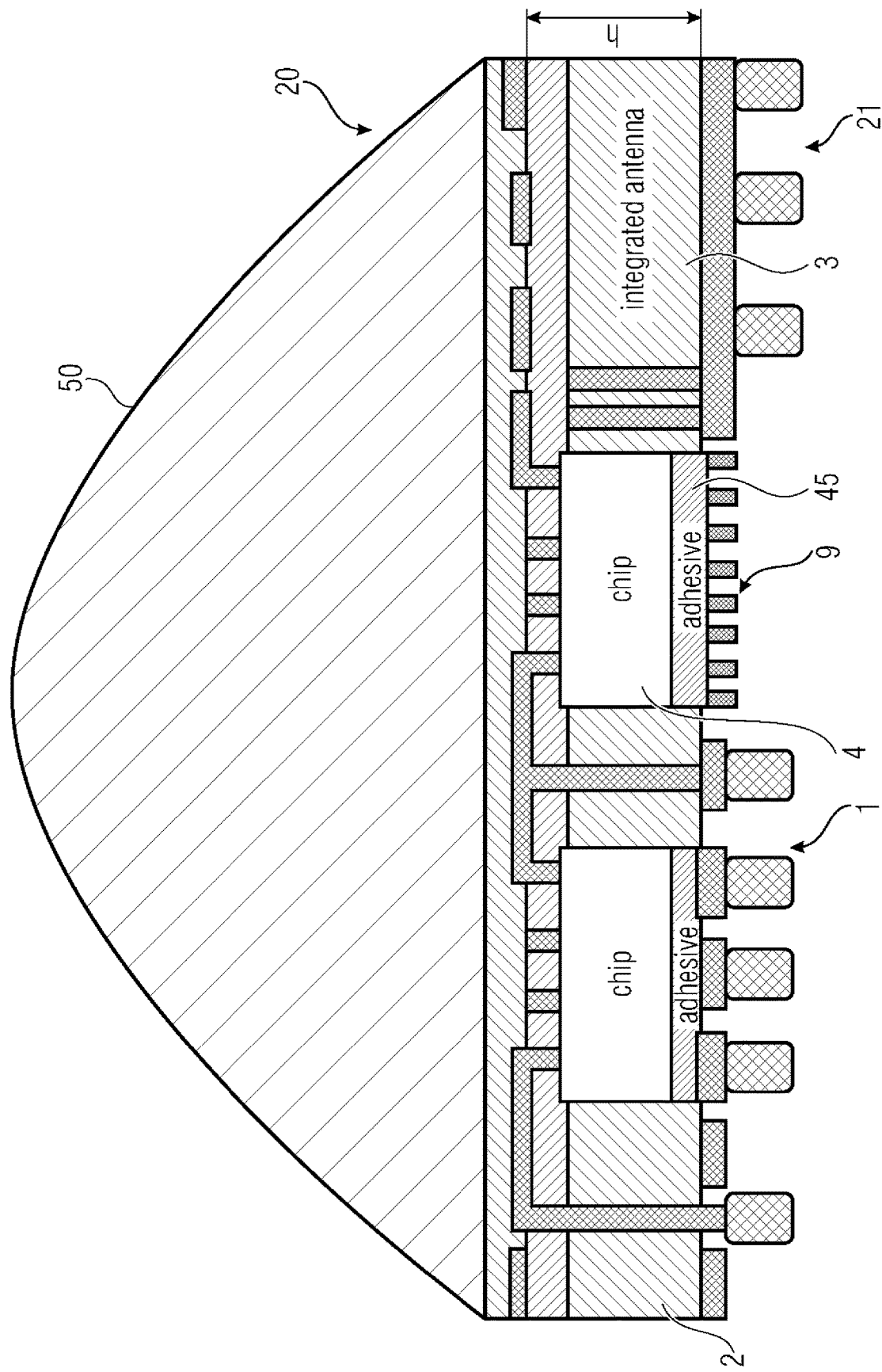
FIG. 12 shows a sectional view of a schematic illustration of a twelfth implementation of the module arrangement.

The module arrangement 1 of FIG. 12 comprises a structure 50 for focusing the radiation of the antenna device 3. This structure 50 here is exemplarily implemented to be a lens. Depending on the implementation, the structure 50 is located only above the emission direction of the antenna device 3 or above the entire top side 20 of the module device 1.

FIG. 13 shows an exemplary arrangement of electronic components 4 and the antenna device 3 within the support layer 2 of a module arrangement 1. The two electronic components 4 implemented as chips here are connected to each other and to the antenna device 3 in order to provide the antenna device 3 with corresponding signals, for example. The antenna device 3 emits electromagnetic signals laterally.

A shielding device 6 which here is formed by two mutually offset series of via holes (so-called shielding vias) is located between the electronic components 4 and the antenna device 3. An electromagnetic protection between the electronic components 4 and the antenna device 3 is realized by the via holes.

FIG. 14a and FIG. 14b show two devices which each comprise four module arrangements 1. The module arrangements 1 here are exemplarily arranged in matrices of 2×2.

In addition, the module arrangements 1 differ in that the respective top side 20 is either interrupted (FIG. 14a) or is formed to be continuous (FIG. 14b).

The individual module arrangements 1 are driven relative to the emission by the respective antenna devices either individually or together so that the results are different emission characteristics.

Figure 15:
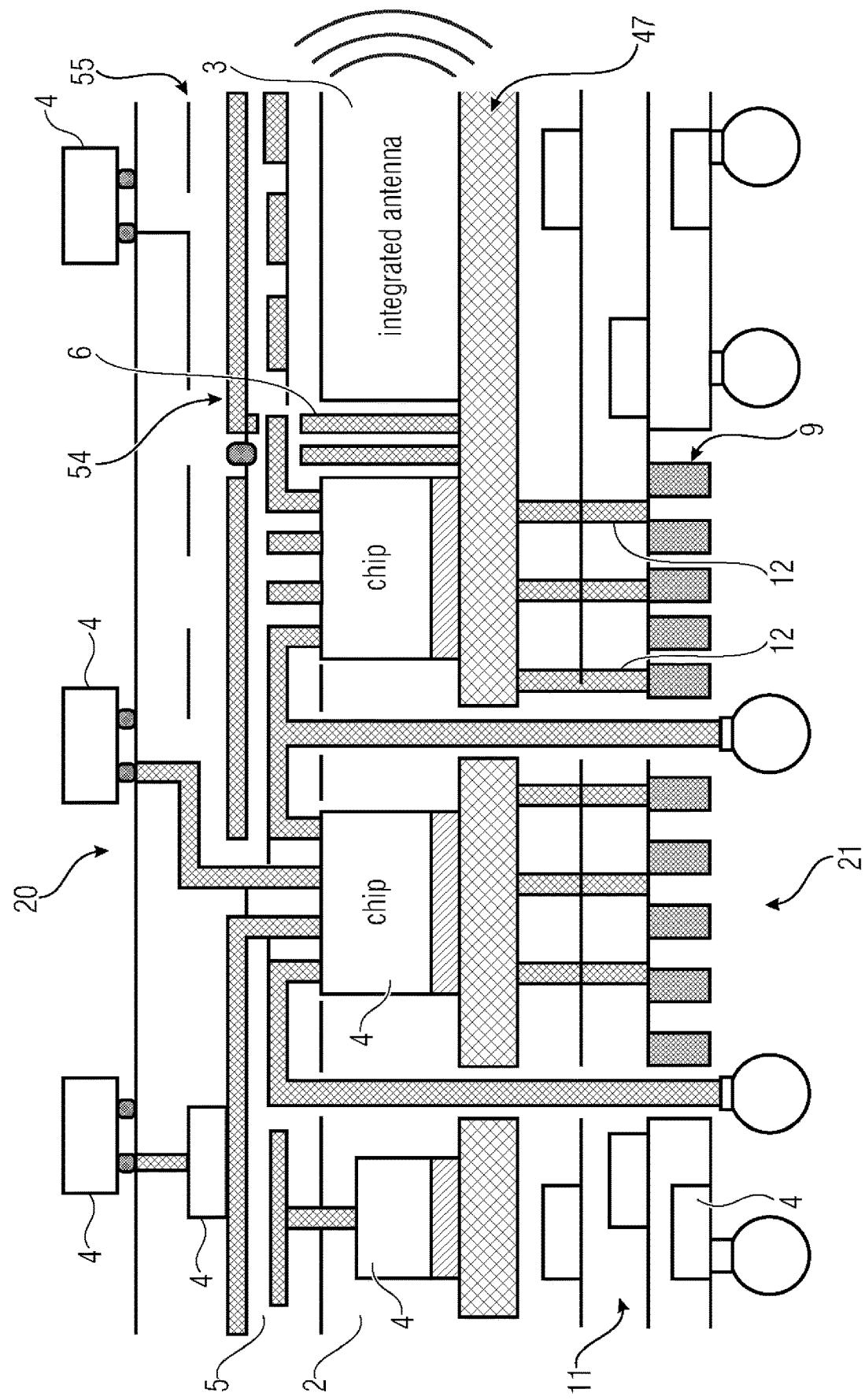
FIG. 15 shows a sectional view of a schematic illustration of another implementation of the module arrangement.

The module arrangement 1 of FIG. 15 comprises several complementary layers 11 with embedded electronic components 4 below the support layer 2 and cover layers 55 above the support layer 2. Electronic components 4 are embedded into the cover layer 55 and further electronic components 4 are additionally located on the cover layers 55.

A shielding layer 54 which causes shielding relative to electromagnetic radiation between the antenna device 3 and the electronic components 4 of the cover layer 55 is located between the cover layers 55 and the support layer 2 with the antenna device 3.

It is to be recognized that the electronic components 4 of the support layer 2 are connected to the electronic components 4 of the cover layer 55 and to the electronic components 4 above the cover layers 55. In addition, the contacting of the electronic components 4 of the support layer 2 is guided to further external components or the bottom side 21 of the module arrangement 1. The same applies to the cooling structure which is realized here by the metal core 47, the via holes 12 implemented as "thermal vias" and the cooling bodies 9.

In the implementation of the module arrangement 1 shown here, the cover layers 55 and the shielding layer 54 cause the antenna device 3 to only emit laterally.

Although some aspects have been described in the context of a device, it is clear that these aspects also represent a description of the corresponding manufacturing method such that a block or element of a device also corresponds to a respective method step or a feature of a method step. Analogously, aspects described in the context of or as a method step also represent a description of a corresponding block or item or feature of a corresponding device.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A module arrangement,
   wherein an antenna device and at least one electronic component are arranged next to each other and within one plane between a top side and a bottom side of the module arrangement,
   wherein a shielding device is provided between the antenna device and the at least one electronic component,
   wherein the shielding device is of a shielding effect relative to electromagnetic signals, wherein the module arrangement comprises a dielectric support layer being a printed circuit board,
   wherein the antenna device and the at least one electronic component are embedded in the printed circuit board,
   wherein the shielding device is embedded at least partly in the printed circuit board,
   wherein contacting terminals of the at least one electronic component are facing a top side of the module arrangement,
   wherein contacts for contacting the module arrangement are merged on a bottom side of the module arrangement,
   wherein a distribution layer for distributing electrical energy and/or electrical signals is provided above the dielectric support layer at the top side of the module arrangement, the distribution layer covering the at least one electronic component and the antenna device, wherein a spacer is provided, and wherein the spacer is arranged in the region of the antenna device between a bottom side of the module arrangement and the antenna device or between a top side of the module arrangement and the antenna device.

2. The module arrangement in accordance with claim 1, wherein the at least one electronic component is thermally connected to a cooling body.

3. The module arrangement in accordance with claim 1, wherein the at least one electronic component is thermally connected to a cooling body via a metal core.

4. The module arrangement in accordance with claim 1, wherein the at least one electronic component is thermally connected to a cooling body via at least one via hole.

5. The module arrangement in accordance with claim 1, wherein the at least one electronic component is thermally connected to a cooling body via a metal core and via at least one via hole.

6. The module arrangement in accordance with claim 1, wherein the module arrangement comprises an antenna substrate, and wherein the antenna substrate supports the antenna device.

7. The module arrangement in accordance with claim 6, wherein the antenna substrate is part of the support layer.

8. The module arrangement in accordance with claim 1, wherein the antenna device is manufactured separately from the module arrangement.

9. The module arrangement in accordance with claim 1, wherein the module arrangement comprises at least one complementary layer, and wherein the complementary layer is arranged between a bottom side of the module arrangement and the support layer.

10. The module arrangement in accordance with claim 1, wherein the module arrangement comprises at least one cover layer, and wherein the cover layer is arranged between a top side and the support layer.

11. The module arrangement in accordance with claim 1, wherein a structure for focusing the radiation of the antenna device is provided.

12. The module arrangement in accordance with claim 1, wherein the module arrangement comprises holes in the region of the antenna device.

13. The module arrangement according to claim 1, wherein the shielding device comprises a number of via holes being located or embedded at least partly in the support layer.

14. The module arrangement according to claim 1, wherein the shielding device is formed by two mutually offset series of via holes being located between the at least one electronic component and the antenna device such that an electromagnetic protection between the at least one electronic component and the antenna device is realized by the via holes.

15. A method for manufacturing a module arrangement, wherein the module arrangement is produced such that an antenna device and at least one electronic component are located within one plane and next to each other and such that a shielding device which is implemented so as to exhibit a shielding effect relative to electromagnetic radiation is provided between the antenna device and the at least one electronic component, wherein the antenna device and the at least one electronic component are embedded in a dielectric support layer being a printed circuit board, wherein the shielding device is embedded at least partly in the dielectric support layer being the printed circuit board, wherein contacting terminals of the at least one electronic component are facing a top side of the module arrangement, wherein contacts for contacting the module arrangement are merged on a bottom side of the module arrangement, providing a distribution layer for distributing electrical energy and/or electrical signals above the dielectric support layer at the top side of the module arrangement, such that the distribution layer covers the at least one electronic component and the antenna device, and providing a spacer and arranging the spacer in the region of the antenna device between a bottom side of the module arrangement and the antenna device or between a top side of the module arrangement and the antenna device.

* * * * *